(12) United States Patent
Riho et al.

(10) Patent No.: US 8,837,242 B2
(45) Date of Patent: Sep. 16, 2014

(54) SEMICONDUCTOR DEVICE AND METHOD INCLUDING REDUNDANT BIT LINE PROVIDED TO REPLACE DEFECTIVE BIT LINE

(71) Applicants: Yoshiro Riho, Tokyo (JP); Yoshio Mizukane, Tokyo (JP); Hiromasa Noda, Tokyo (JP)

(72) Inventors: Yoshiro Riho, Tokyo (JP); Yoshio Mizukane, Tokyo (JP); Hiromasa Noda, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 14/163,368

(22) Filed: Jan. 24, 2014

(65) Prior Publication Data

US 2014/0140155 A1 May 22, 2014

Related U.S. Application Data (63) Continuation of application No. 13/396,985, filed on Feb. 15, 2012, now Pat. No. 8,638,625.

(30) Foreign Application Priority Data

Feb. 18, 2011 (JP) ................................. 2011-032839

(51) Int. Cl.
*G11C 7/00* (2006.01)
(52) U.S. Cl.
USPC ...................... 365/200; 365/230.03; 365/222
(58) Field of Classification Search
USPC ..................................... 365/200, 230.03, 222
See application file for complete search history.

(56) References Cited

U.S. PATENT DOCUMENTS

| | | | |
|---|---|---|---|
| 5,787,043 A | 7/1998 | Akioka et al. | |
| 5,953,270 A * | 9/1999 | Kim | ............................... 365/200 |
| 6,819,605 B2 | 11/2004 | Kato | |
| 7,254,069 B2 | 8/2007 | Haraguchi et al. | |
| 7,433,251 B2 | 10/2008 | Haraguchi et al. | |
| 7,495,978 B2 | 2/2009 | Hasegawa et al. | |

FOREIGN PATENT DOCUMENTS

| | | |
|---|---|---|
| JP | H3-105799 (A) | 5/1991 |
| JP | 5-28794 A | 2/1993 |
| JP | 2003-217294 (A) | 7/2003 |
| JP | 2004-63023 (A) | 2/2004 |

OTHER PUBLICATIONS

Notice of Allowance dated Sep. 26, 2013 in U.S. Appl. No. 13/396,985.

* cited by examiner

*Primary Examiner* — Son Dinh
*Assistant Examiner* — Nam Nguyen
(74) *Attorney, Agent, or Firm* — McGinn IP Law Group, PLLC (57) ABSTRACT

A method includes selecting a word line included in one of a plurality of memory mats based on a row address, where each of the plurality of memory mats includes a plurality of word lines, a plurality of bit lines, and a redundant bit line, selecting one of the bit lines included in the selected memory mat based on a column address, selecting, by a column relief circuit, the redundant bit line in place of the one of the bit lines to be selected based on the column address, in response to the column address indicating a defective address, activating the column relief circuit when the row address is supplied in response to a first command, and inactivating the column relief circuit when the row address is supplied in response to a second command.

17 Claims, 9 Drawing Sheets

SEMICONDUCTOR DEVICE AND METHOD INCLUDING REDUNDANT BIT LINE PROVIDED TO REPLACE DEFECTIVE BIT LINE

CROSS-REFERENCE TO RELATED APPLICATIONS

This Application is a Continuation Application of U.S. patent application Ser. No. 13/396,985, filed on Feb. 15, 2012. This application is based on and claims priority from Japanese Patent Application No. 2011-032839 filed on Feb. 18, 2011. The disclosure thereof is incorporated herein by reference in its entirety.

BACKGROUND OF THE INVENTION

1. Field of the Invention

The present invention relates to a semiconductor device, and more particularly relates to a semiconductor device that performs an alternative access to a redundant bit line instead of a defective bit line when a column address to be accessed indicates the defective bit line.

2. Description of Related Art

In a semiconductor memory device exemplified by DRAM (Dynamic Random Access Memory), a word line is selected based on a row address and a bit line is selected based on a column address, thereby accessing a memory cell arranged at an intersection of these lines. However, along with the recent increase in the memory capacity of semiconductor memory devices, some defective word lines and defective bit lines that do not operate properly are inevitably included in the semiconductor memory devices. Therefore, it is essential to incorporate a row relief circuit and a column relief circuit that relieve defects by replacing defective word lines or defective bit lines respectively by redundant word lines or redundant bit lines.

When a row address indicates a defective word line, a redundant word line is selected under control of the row relief circuit. Similarly, when a column address indicates a defective bit line, a redundant bit line is selected under control of the column relief circuit. Therefore, the row relief circuit starts an address comparing operation in response to the row address, and the column relief circuit starts an address comparing operation in response to the column address.

Because the number of memory cells connectable to one word line or one bit line is limited, a memory cell array is divided into a plurality of memory mats or memory blocks in semiconductor memory devices of recent years. A memory mat refers to a range extending one word line and one bit line. When the memory cell array is divided into a plurality of memory mats, a memory mat to be selected is determined by a row address, and therefore apart of an operation of the column relief circuit can be started at the time of supplying the row address (see Japanese Patent Application Laid-open No. H5-28794).

However, the supply of the row address is not necessarily accompanied by the supply of the column address. That is, in a normal access, a row address is supplied in response to an active command, and a column address is supplied next in response to a read command or a write command. In a refresh operation, only row addresses (refresh addresses) are supplied from a refresh counter without any subsequent supply of column addresses.

Therefore, in the refresh operation, it is not necessary for the column relief circuit to start an address comparing operation in response to the supply of row addresses. Such an operation rather causes unnecessary current consumption. This problem occurs not only to refresh operations but also to all operations commonly for which any column access is not necessary after a row access.

SUMMARY

In one embodiment, there is provided a semiconductor device that includes: a plurality of memory mats each including a plurality of word lines, a plurality of bit lines, a redundant bit line, and a plurality of memory cells arranged at intersections of the word lines and the bit lines and intersections of the word lines and the redundant bit line, respectively; a row decoder that selects one of the word lines included in one of the memory mats based on a row address; a column decoder that selects one of the bit lines included in the selected memory mat based on a column address; a column relief circuit that selects the redundant bit line in place of the one of the bit lines to be selected based on the column address, in response to the column address indicating a defective address; and a determination circuit that activates the column relief circuit when the row address is supplied to the row decoder in response to a first command, and inactivates the column relief circuit when the row address is supplied to the row decoder in response to a second command.

In another embodiment, there is provided a semiconductor device that includes: a memory cell array circuit including a plurality of memory mats, each of the memory mats comprising a plurality of memory cell sets, each of the memory cell sets including a plurality of normal memory cells and at least one redundant memory cell; a first access control circuit accessing the memory cell array circuit in response to each of first address information and second address information, the first address information being supplied from outside of the device, the second address information being produced inside the device, each of the first and second address information including first and second address parts, the first address part designating one of the memory mats, the second address part designating one of the memory cell sets; and a second access control circuit receiving third address information and storing a plurality of defective address information, the second access control circuit including a redundant control circuit that is configured to select at least one of the plurality of defective address information in response to information related to the first address part and access the redundant memory cell in place of the normal memory cells when the third address information is coincident with a selected one of the plurality of defective address information, the redundant control circuit being activated when the first address information is supplied to the first access control circuit and deactivated when the second address information is supplied to the first access control circuit.

In still another embodiment, a device includes a plurality of memory banks each including a plurality of memory mats, each of the memory mats including a plurality of normal word lines, a plurality of normal bit lines each intersecting the normal word lines, a plurality of normal memory cells each disposed at an associated one of intersections of the normal word and normal bit lines, at least one redundant bit lines intersecting the normal word lines, and a plurality of redundant memory cells each disposed at an associated one of intersections of the normal word lines and the redundant bit line; a plurality of row access circuits each coupled to an associated one of the memory banks, each of the row access control circuits being supplied with row address information and configured to select one of the memory mats in response to a first part of the row address information and one of normal word lines of a selected memory mat in response to a second part of the row address information; and a plurality of column access circuits each coupled to an associated one of the memory banks, each of the column access circuits being supplied with column address information and mat designation information related to the first part of the row address information and storing a plurality of column defective addresses, each of the column access circuits being activated in a data read/write operation mode to select at least one of the defective addresses in response to the mat designation information and to select one of normal bit lines when the column address information is not coincident with a selected one of the defective addresses and the redundant bit line when the column address information is coincident with the selected one of the defective addresses, and each of the column access circuits being deactivated in a refresh operation mode.

DETAILED DESCRIPTION OF THE EMBODIMENTS

Preferred embodiments of the present invention will be explained below in detail with reference to the accompanying drawings.

Figure 1:
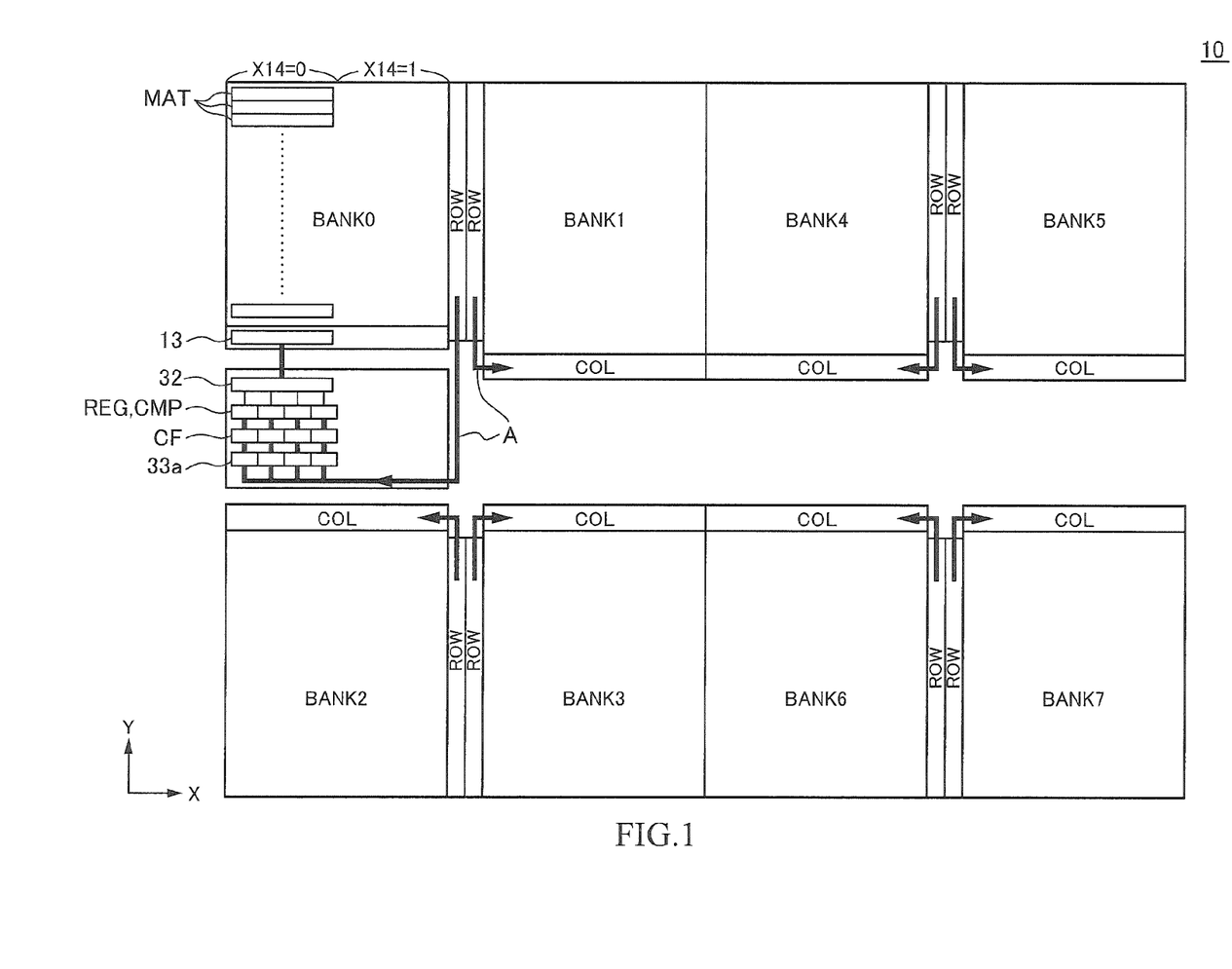
FIG. 1 is a schematic plan view for explaining a layout of a semiconductor device 10 according to an embodiment of the present invention.

Referring now to FIG. 1, the semiconductor device 10 according to the present embodiment includes a memory cell array divided into eight banks 0 to 7. Since the banks are units that can individually receive commands, nonexclusive concurrent operations can be performed among the banks. In an example shown in FIG. 1, the banks 0, 1, 4, and 5 are arranged in line in an X direction whereas the banks 2, 3, 6, and 7 are arranged in line in the X direction.

Each of the banks includes a row access circuit ROW for performing a row access and a column access circuit COL for performing a column access. The row access circuit ROW selects a word line included in the memory cell array based on a row address. The column access circuit COL selects a bit line included in the memory cell array based on a column address.

In the present embodiment, a part of the row address is supplied to the column access circuit COL as indicated by an arrow A in FIG. 1. This is because the memory cell array is divided into a plurality of mats. That is, defective bit lines differ among the memory mats, and thus, when the row access circuit ROW selects one of the memory mats, it is necessary to start reading of an address of a defective bit line (a column relief address) corresponding to the selected memory mat. As shown in FIG. 1, the column access circuits COL includes a decoding circuit 33a, column fuses CF, a register circuit REG, an address comparing circuit CMP, a column pre-decoder 32 and the like. These elements are described later in detail.

Figure 2:
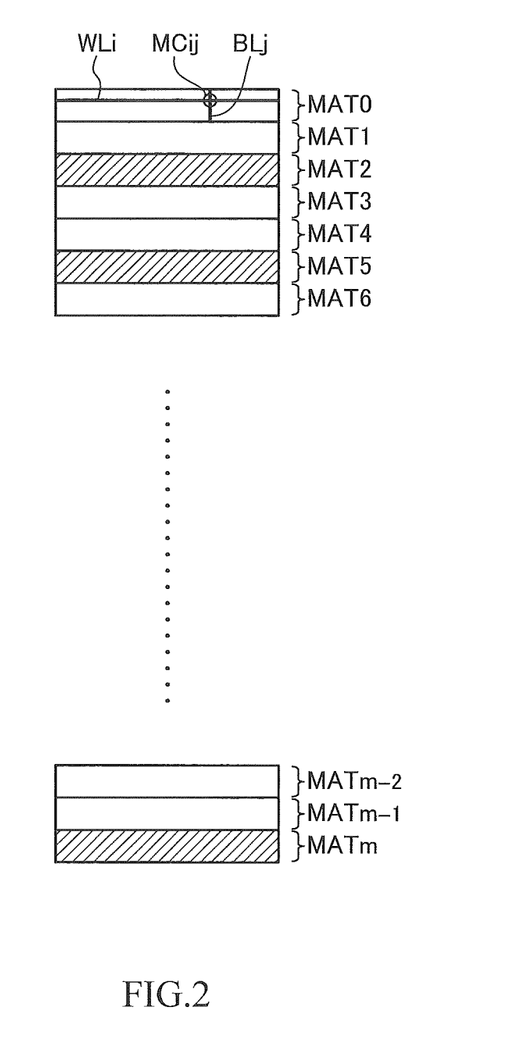
FIG. 2 is a schematic diagram for explaining a configuration of a memory mats in each bank.

Turning to FIG. 2, each bank is constituted by m+1 memory mats from MAT0 to MATm. A part of a row address supplied at the time of a row access selects one of these memory mats. That is, the row address includes a part that selects one of the memory mats and another part that selects one of a plurality of word lines included in the selected memory mat. FIG. 2 shows an example of selecting a predetermined word line WLi within the memory mat MAT0. A column address supplied at the time of a column access is used to select one of a plurality of bit lines included in the selected memory mat. In the example of FIG. 2, a predetermined bit line BLj within the memory mat MAT0 is selected at the time of the column access. Accordingly, a memory cell MCij located at the intersection between the word line WLi and the bit line BLj is to be accessed.

Among the memory mats MAT0 to MATm shown in FIG. 2, non-hatched memory mats are memory mats that do not include redundant word lines, whereas hatched memory mats are memory mats that include redundant word lines. In the example of FIG. 2, the memory mats including redundant word lines are provided at a rate of one per three mats, although the present invention is not limited to this example.

Figure 3:
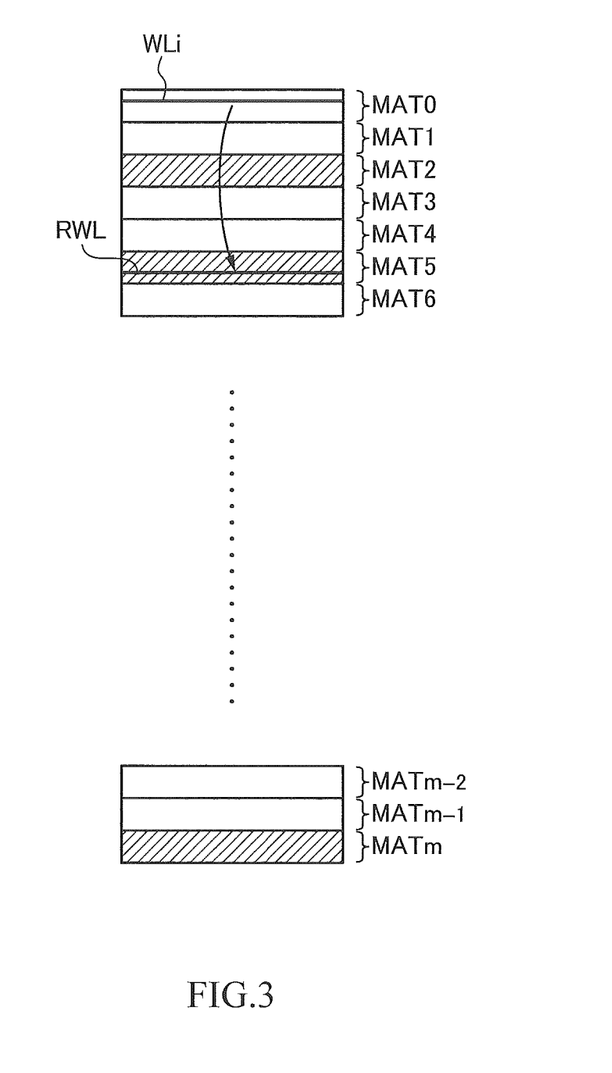
FIG. 3 is a schematic diagram for explaining a replacement operation of a word line.

Turning to FIG. 3, when the word line WLi to be selected by a row address is a defective word line, a redundant word line RWL that is a spare word line replaces the defective word line WLi. Because the word line WLi selected by the row address belongs to the memory mat MAT0 that does not include a redundant word line, FIG. 3 shows an example of designating the redundant word line RWL in the memory mat MAT5 as a destination. In this way, when a row redundant operation is performed, the selected memory mat may be changed. It is worth noting that a defective word line means not only a word line having a defect itself such as breaking but also a word line having no defect itself but unable to be properly selected due to defective memory cells connected thereto.

Figure 4:
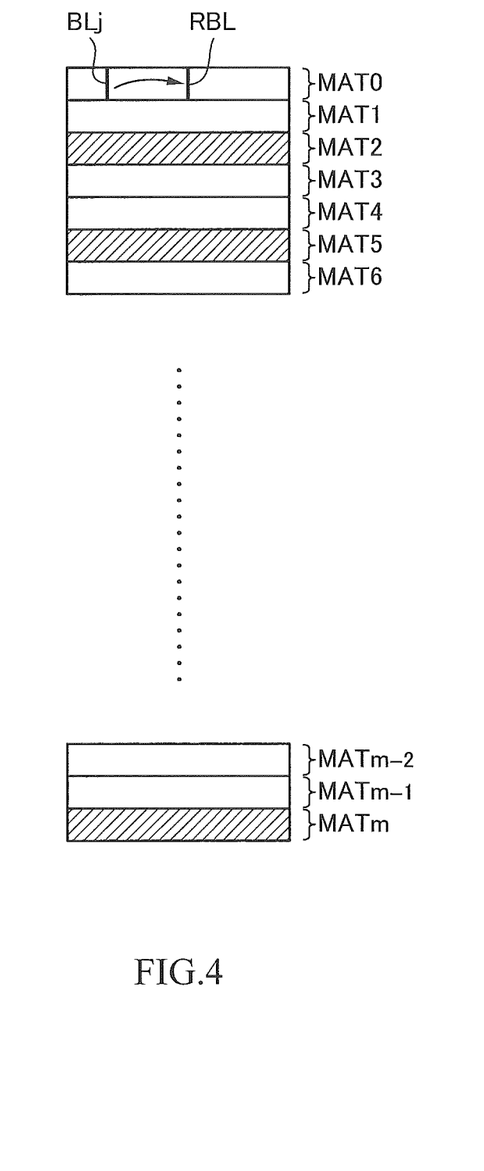
FIG. 4 is a schematic diagram for explaining a replacement operation of a bit line.

Turning to FIG. 4, when the bit line BLj selected by a column address is a defective bit line, the bit line BLj is replaced with a redundant bit line RBL that is a spare bit line. Bit line replacement is always made within the same memory mat, and therefore a column redundant operation does not cause any change in the selected memory mat. This means that selecting one memory mat is always determined in the row address. It is worth noting that a defective bit lines means not only a bit line having a defect itself such as breaking but also a bit line having no defect itself but unable to be properly selected due to defective memory cells or a column selection line connected to them.

As shown in FIG. 1, while the most significant bit X14 of the row address selects either a high-order memory mat or a low-order memory mat in the present embodiment, this feature is not essential in the present invention.

Figure 5:
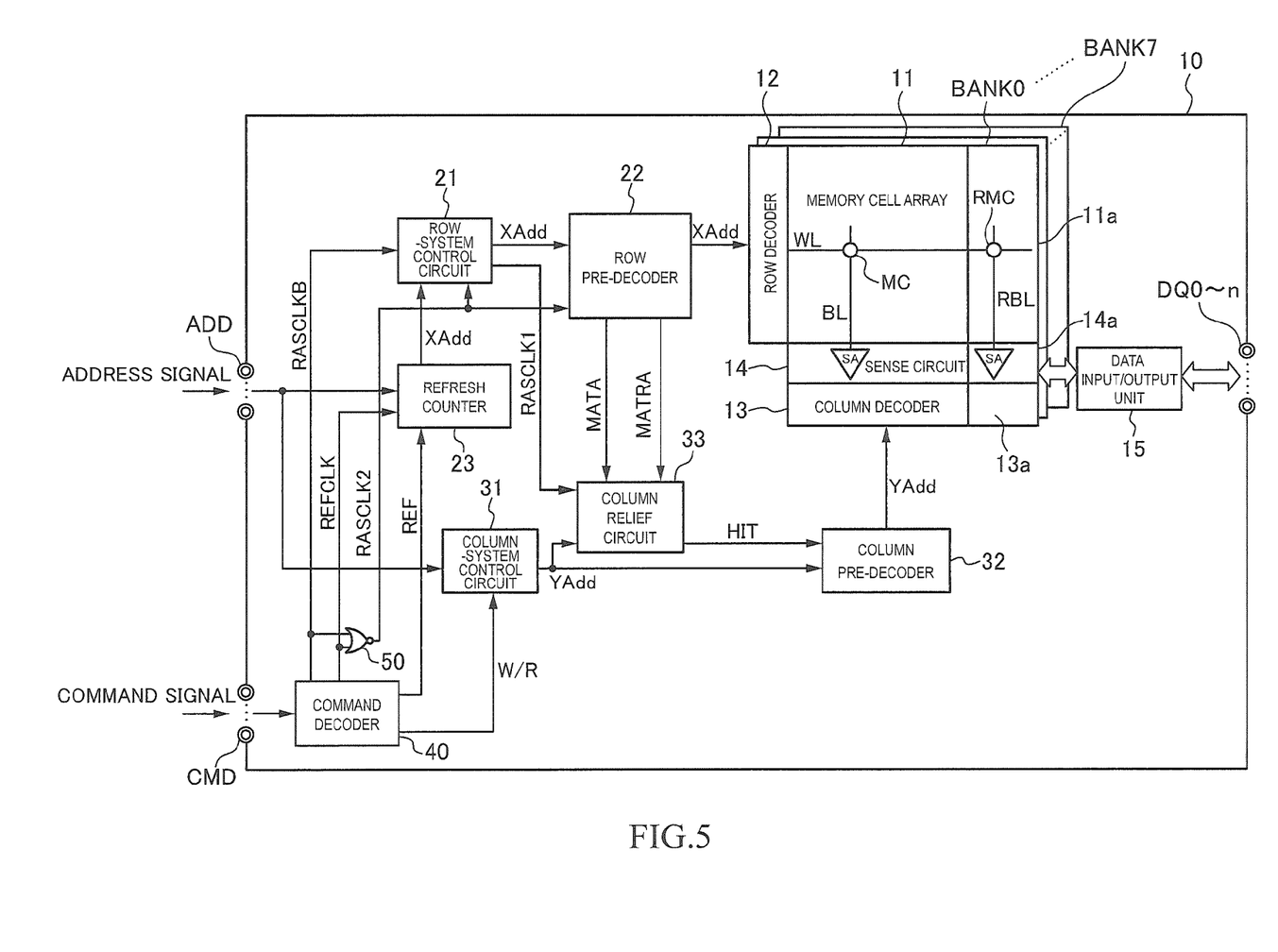
FIG. 5 is a block diagram for explaining a functional configuration of the semiconductor device 10.

Turning to FIG. 5, each bank includes a row decoder 12 for selecting one of the word lines WL in a memory cell array 11 and a column decoder 13 for selecting one pair of the bit lines BL. Memory cells MC are arranged at intersections between the word lines WL and the bit lines BL, respectively. Although FIG. 5 shows only one memory cell MC arranged at an intersection between one word line WL and one bit line BL, it is needless to mention that the memory cell array 11 actually includes many word lines WL, many bit lines BL, and a plurality of memory cells MC arranged at the intersections between the word lines WL and the bit lines BL, respectively.

Each of the bit lines BL is connected to a corresponding sense amplifier SA included in a sense circuit 14. The bit line BL selected by the column decoder 13 is connected to a data input/output unit 15 via the corresponding sense amplifier SA. The data input/output unit 15 outputs read data read from the memory cell array 11 to data input/output terminals DQ0 to DQn in a reading operation, and supplies write data supplied from the data input/output terminals DQ0 to DQn to the memory cell array 11 in a writing operation.

Furthermore, each bank includes a column redundant cell array 11a. The column redundant cell array 11a includes redundant bit lines RBL, and redundant memory cells RMC are arranged at intersections between the redundant bit lines RBL and the word lines WL, respectively. The redundant bit lines RBL are connected to corresponding redundant sense amplifiers SA. A redundant column decoder 13a selects one of the redundant bit lines RBL. While each bank also includes a row redundant cell array including redundant word lines RWL, the row redundant cell array is not shown in FIG. 5.

Operations of the row decoder 12 are controlled by a row-system control circuit 21, a row pre-decoder 22, and a refresh counter 23. The row decoder 12, the row-system control circuit 21, the row pre-decoder 22, and the refresh counter 23 correspond to the row access circuit ROW shown in FIG. 1.

Operations of the column decoder 13 and the redundant column decoder 13a are controlled by a column-system control circuit 31, the column pre-decoder 32, and a column relief circuit 33. The column decoder 13, the redundant column decoder 13a, the column-system control circuit 31, the column pre-decoder 32, and the column relief circuit 33 correspond to the column access circuit COL shown in FIG. 1.

Operations of the row-system control circuit 21 and the column-system control circuit 31 are controlled by a command decoder 40. The command decoder 40 decodes command signals supplied from outside via command terminals CMD and generates various internal signals based on the result of decoding. For example, when a command signal indicates an active command, the command decoder 40 activates an internal active clock signal RASCLKB to a low level for a certain period of time. When the internal active clock RASCLKB is activated to a low level, the row-system control circuit 21 supplies the internal row address XAdd to the row pre-decoder 22. The word line WL indicated by the internal row address XAdd is accessed accordingly.

The internal row address XAdd is supplied from the refresh counter 23. In a normal operation, an address signal supplied to an address terminal ADD is used as it is as the internal row address XAdd. In a refresh operation, a refresh address held in the refresh counter 23 is used as the internal row address XAdd. Therefore, the refresh counter 23 shown in FIG. 5 functions as a selector that outputs either the address signal supplied via the address terminal ADD or the refresh address held in the refresh counter 23. The selection is based on an internal refresh clock REFCLK supplied from the command decoder 40.

When the command signal indicates a refresh command, the command decoder 40 activates the internal active clock signal RASCLKB to a low level for a plurality of times and activates the internal refresh clock signal REFCLK to a high level. With this operation, the internal row address XAdd output from the refresh counter 23 becomes equal to the value of an internal counter (not shown) included in the refresh counter 23. The word line WL indicated by the value is selected accordingly. Activating the internal active clock signal RASCLKB for a plurality of times is intended to reduce a peak current by temporally dispersing the selection of word lines WL because many word lines WL are selected in the refresh operation. Furthermore, the command decoder 40 supplies an internal refresh signal REF to the refresh counter 23, and the value of the internal counter included in the refresh counter 23 is updated in response to the internal refresh signal REF.

As shown in FIG. 5, the internal active clock signal RASCLKB and the internal refresh clock signal REFCLK are supplied to a NOR gate circuit 50. The NOR gate circuit 50 functions as a determination circuit. An output signal from the NOR gate circuit 50 is supplied, as an internal active clock signal RASCLK2, to the row-system control circuit 21 and the row pre-decoder 22. The function of the internal active clock signal RASCLK2 is described later.

Meanwhile, when the command signal indicates a read command or a write command, the command decoder 40 activates a write/read signal W/R. When the write/read signal W/R is activated, the column-system control circuit 31 takes in the address signal supplied from the address terminal ADD as an internal column address YAdd and supplies the internal column address YAdd to the column pre-decoder 32 and the column relief circuit 33. The column relief circuit 33 outputs a relief-determination output signal HIT when the internal column address YAdd supplied from the column-system circuit is an address of a defective bit line. When the relief-determination output signal HIT is activated, the column pre-decoder 32 supplies a redundant column address associated in advance with the relief-determination output signal HIT to the redundant column decoder 13a. With this process, the redundant column decoder 13a performs the column redundant operation.

Figure 6:
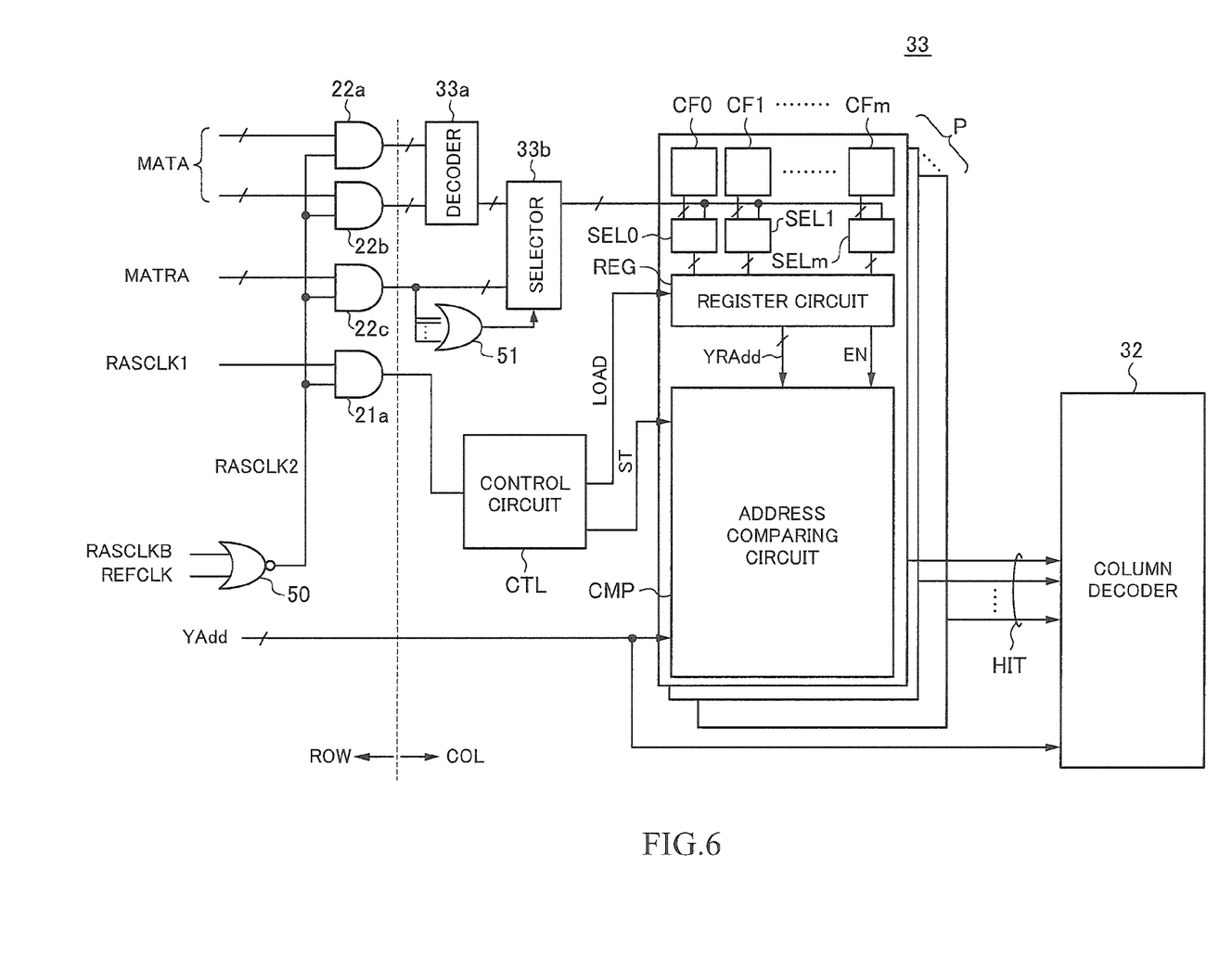
FIG. 6 is a block diagram indicative of a circuit configuration of a column relief circuit 33 shown in FIG. 5.

Turning to FIG. 6, the column relief circuit 33 includes P column relief circuit sets. Each of the column relief sets includes m+1 fuse sets CF0 to CFm (hereinafter, also simply "CF") serving as an address storing circuit, selectors SEL0 to SELm to select one of these fuse sets CF0 to CFm, the register circuit REG to hold a content (a column relief address) stored in the selected fuse set CF, and the address comparing circuit CMP to compare the column relief address held in the register REG with the internal column address YAdd. FIG. 1 shows an example of P=4, that is, providing four column relief circuit sets in the column relief circuit 33.

The m+1 fuse sets CF0 to CFm correspond to the m+1 memory mats MAT0 to MATm, respectively. Each of the fuse sets CF stores only one address of a defective bit line. In the present embodiment, the internal column address YAdd is a seven-bit signal, although the number of bits is not limited to seven, and the address stored in each of the fuse sets CF is also a seven-bit signal. However, note that each of the fuse sets stores a signal of eight bits in total because one enable bit EN indicating whether an effective address is stored in the fuse set CF is necessary to add to the signal.

The selectors SEL0 to SELm select only one of these m+1 fuse sets CF0 to CFm. The selection made by the selectors SEL0 to SELm is linked to the selection of the memory mat based on a row access. That is, when the memory mat MAT0 is selected based on the row access, the fuse set CF0 corresponding to the selected memory mat MAT0 is selected. When the memory mat MAT1 is selected based on the row access, the fuse set CF1 corresponding to the selected memory mat MAT1 is selected. Accordingly, the selectors SEL0 to SELm select one of these m+1 fuse sets CF0 to CFm using a mat address MATA used for the selection of the memory mat. The row pre-decoder 22 supplies the pre-decoded mat address MATA to the column relief circuit 33.

Therefore, the decoder 33a within the column relief circuit 33 decodes the mat address MATA, and the selectors SEL0 to SELm are operated based on the result of decoding.

Furthermore, as described with reference to FIG. 3, when a word line replacement is performed by the row redundant operation, a memory mat different from the original memory mat indicated by the mat address MATA may be accessed. When such a row redundant operation is performed, a mat address to be relieved (relief mat address) MATRA has a priority over the mat address MATA. The relief mat address MATRA is a decoded signal indicating each of the hatched memory mats shown in FIG. 3 and the like. When one bit of the relief mat address MATRA is activated, an OR gate circuit 51 switches a selector 33b to be controlled not by an output from the decoder 33a but by the relief mat address MATRA.

As shown in FIG. 6, the pre-decoded mat address MATA and the decoded relief address MATRA are supplied to the column relief circuit 33 via AND gate circuits 22a to 22c included in the row pre-decoder 22. The internal active clock signal RASCLK2 output from the NOR gate circuit 50 is supplied to the AND gate circuits 22a to 22c. Therefore, when the logic level of the internal active clock signal RASCLK2 is low, output signals from the AND gate circuits 22a to 22c are all fixed to a low level.

The internal active clock signal RASCLK2 is also supplied to one input node of an AND gate circuit 21a included in the row-system control circuit 21. An internal active clock signal RASCLK1 interlocked with the internal active clock signal RASCLKB is supplied to the other input node of the AND gate circuit 21a. The internal active clock signal RASCLK1 activates the register REG and the address comparing circuit CMP included in the column relief circuit 33. Accordingly, when the level of the internal active clock signal RASCLK2 is low, the register REG and the address comparing circuit CMP are not activated.

The internal active clock signal RASCLK1 having passed through the AND gate circuit 21a is supplied to a control circuit CTL included in the column relief circuit 33. When the internal active clock signal RASCLK1 is activated to a high level, the control circuit CTL activates a column fuse load signal LOAD and a start signal ST, thereby activating the register REG and the address comparing circuit CMP.

When the column fuse load signal LOAD is activated, the register REG carries a current across one fuse set CF selected by the selectors SEL0 to SELm, thereby executing reading data from eight fuse elements (not shown) constituting the selected fuse set CF. As the fuse elements, optical fuse elements that can be disconnected by a laser beam or anti-fuse elements that can have dielectric breakdown when a high voltage is applied can be employed although the type of fuse elements are not limited thereto. Whichever type of fuse elements is employed, it is necessary to, for example, apply a current and perform a sense operation unlike a case of reading data from a so-called latch circuit. Therefore it takes a certain length of time to read data, and current consumption is high during reading. However, the use of fuse elements to store the address of the defective bit line is not essential in the present invention, and arbitrary elements can be employed as long as these elements are nonvolatile memory elements.

The address comparing circuit CMP compares information on the fuse set CF, which is read synchronously with the column fuse load signal LOAD, with the internal column address YAdd.

Figure 7:
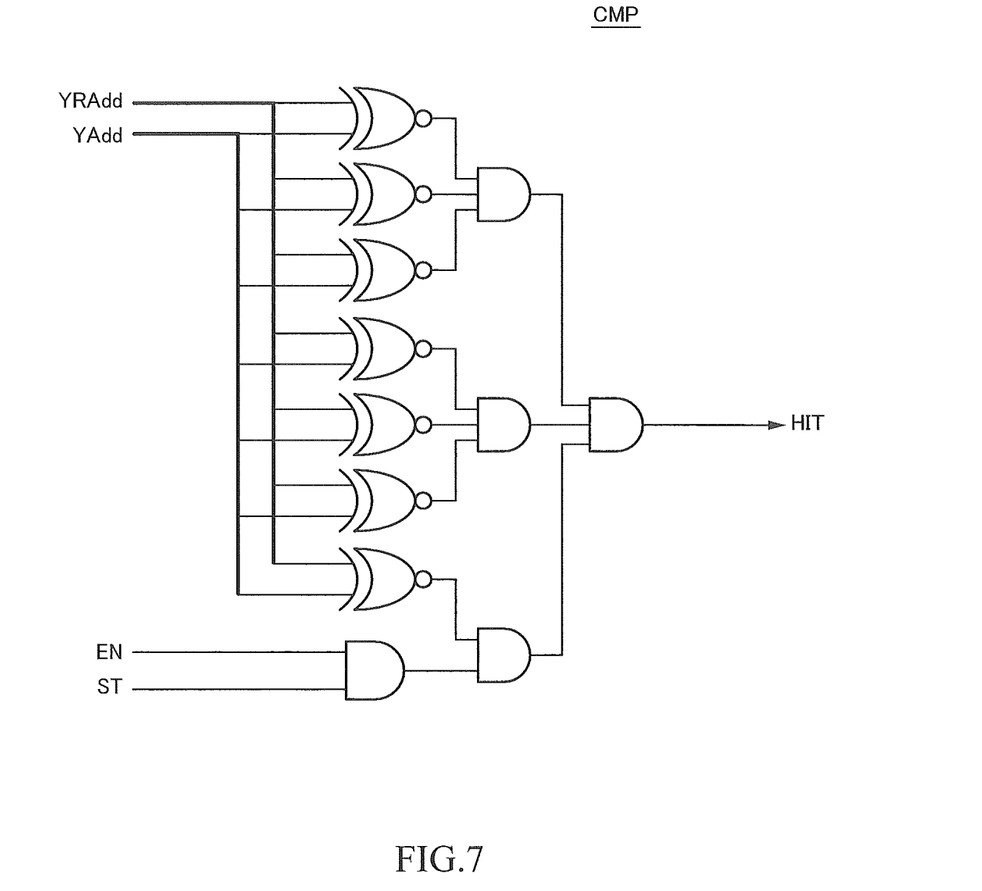
FIG. 7 is a circuit diagram of an address comparing circuit CMP shown in FIG. 6.

Turning to FIG. 7, the address comparing circuit CMP includes seven XNOR gate circuits that compare respective bits of a column relief address YRAdd read by the register circuit REG with respective bits of the internal column address YAdd, an AND gate circuit that receives the enable bit EN and the start signal ST, and an eight-input AND gate circuit that receives output signals from these seven XNOR circuits and the AND gate. With this circuit configuration, the relief-determination output signal HIT is activated to a high level on condition that all the bits of the column relief address YRAdd match the bits of the internal column address YAdd and that both the enable bit EN and the start signal ST are activated to a high level. Therefore, when the logic level of the start signal ST is low, the relief-determination output signal HIT is fixed to a low level, and thus current consumption required for an address comparing operation can be reduced.

An operation of the semiconductor device 10 according to the present embodiment is explained next.

Figure 8:
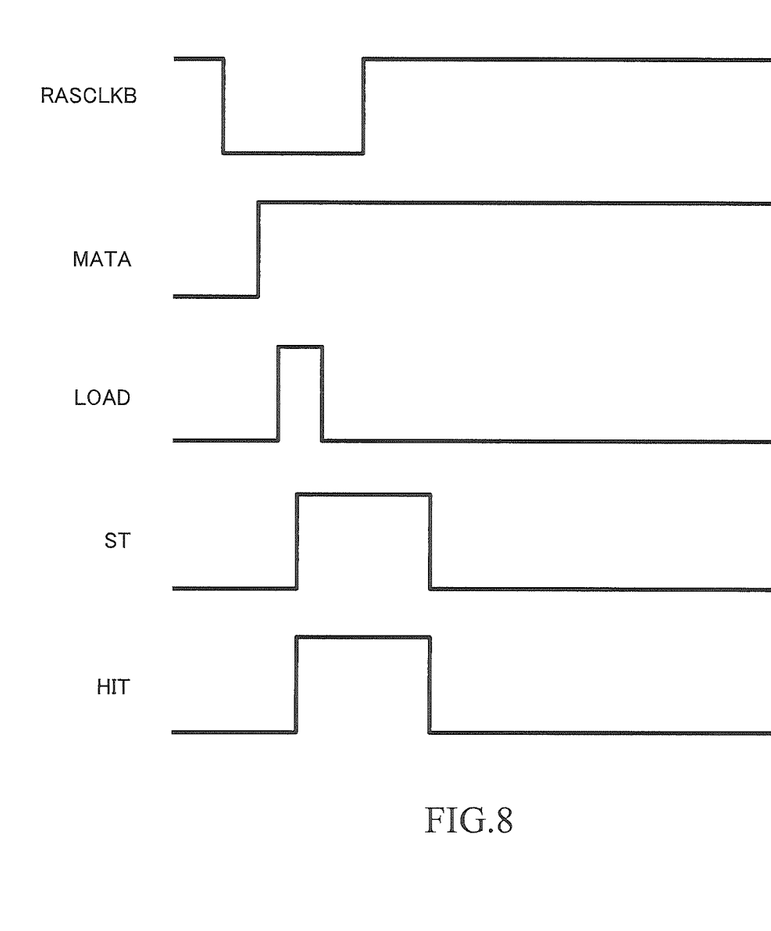
FIG. 8 is a timing diagram for explaining an operation when an active command is issued.

Turning to FIG. 8, when the internal active clock signal RASCLKB is activated to a low level in response to the active command, either the mat address MATA or the relief mat address MATRA is supplied from the row pre-decoder 22 to the column relief circuit 33 based on a row address supplied synchronously with the active command. As a result, the selectors SEL0 to SELm shown in FIG. 6 select one of the m+1 fuse sets CF0 to CFm. Thereafter, the column fuse load signal LOAD is activated, whereby data is read from the selected fuse set CF. Furthermore, the start signal ST is activated, thereby permitting the address comparing circuit CMP to perform an address comparing operation.

Accordingly, thereafter, when a column address is supplied synchronously with a read command or a write command, the column decoder 13 operates if the input column address does not match the column relief address YRAdd. On the other hand, the redundant column decoder 13a operates if the input column address matches the column relief address YRAdd. In this way, a preparation of the column redundant operation is started in response to the active command, and therefore, as soon as the column address is supplied, the address comparing circuit CMP can perform the address comparing operation.

Figure 9:
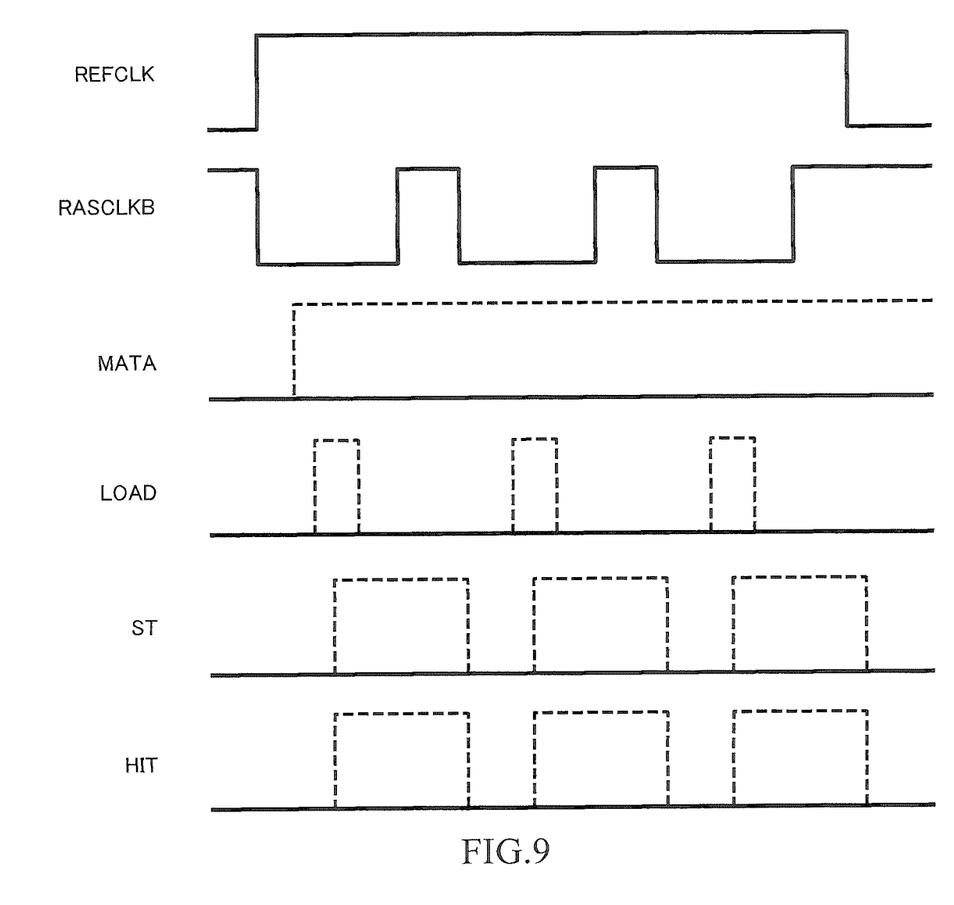
FIG. 9 is a timing diagram for explaining an operation when a refresh command is issued.

When a refresh command is issued, the internal active clock signal RASCLKB is activated to a low level and the internal refresh clock signal REFCLK is activated to a high level. The logic level of the internal active clock signal RASCLK2 output from the NOR gate circuit 50 shown in FIGS. 5 and 6 becomes low, accordingly. As a result, as shown in FIG. 9, the mat address MATA and the relief mat address MATRA are fixed to a predetermined value, irrespective of the value of the row address supplied synchronously with the refresh command. Furthermore, the column fuse load signal LOAD and the start signal ST are not activated, as indicated by solid lines in FIG. 9. This configuration can reduce a switching current along with the changes in the mat address MATA and the relief mat address MATRA, reduce the current consumption resulting from reading of data from the fuse sets CF0 to CFm, and reduce the current consumption resulting from the address comparing operation.

In FIG. 9, broken lines indicate waveforms when the measures mentioned above are not taken. In this case, the column fuse load signal LOAD and the start signal ST are activated each time the internal active clock signal RASCLKB is activated to a low level. However, any column access is unnecessary in the refresh operation and therefore any preparation of the column access is originally unnecessary. On the other hand, the semiconductor device 10 according to the present embodiment can reduce unnecessary current consumption because of elimination of the preparation of the unnecessary column access in the refresh operation.

As described above, the semiconductor device 10 according to the present embodiment permits the column relief circuit 33 to operate when a row address is supplied in response to an active command, and prohibits the column relief circuit 33 from operating if a row address is supplied in response to a refresh command. Therefore, it is possible to reduce current consumption resulting from unnecessary column redundant operations.

It is apparent that the present invention is not limited to the above embodiments, but may be modified and changed without departing from the scope and spirit of the invention.

What is claimed is:

1. A method comprising:
   selecting a word line included in one of a plurality of memory mats based on a row address,
   wherein each of the plurality of memory mats includes a plurality of word lines, a plurality of bit lines, and a redundant bit line;
   selecting one of the bit lines included in the selected memory mat based on a column address;
   selecting, by a column relief circuit, the redundant bit line in place of the one of the bit lines to be selected based on the column address, in response to the column address indicating a defective address;
   activating the column relief circuit when the row address is supplied in response to a first command; and
   inactivating the column relief circuit when the row address is supplied in response to a second command.

2. The method as claimed in claim 1, wherein:
   the selecting of the word line included in the one of a plurality of memory mats based on the row address is performed by a row decoder,
   the selecting of the one of the bit lines included in the selected memory mat based on the column address is performed by a column decoder,
   the activating of the column relief circuit is when the row address is supplied to the row decoder in response to the first command; and
   the inactivating of the column relief circuit is when the row address is supplied to the row decoder in response to the second command.

3. The method as claimed in claim 1, wherein the first command is an active command and the second command is a refresh command.

4. The method as claimed in claim 1, further comprising:
   storing the defective address in an address storing circuit, the column relief circuit includes the address storing circuit; and
   prohibiting reading the defective address, by the determination circuit, from the address storing circuit in response to the second command.

5. The method as claimed in claim 4, wherein the address storing circuit comprises a plurality of nonvolatile memory elements.

6. The method as claimed in claim 4, further comprising invalidating, by the determination circuit, a selecting operation of the address storing circuit based on the row address in response to the second command,
   wherein the address storing circuit is provided in each of the memory mats.

7. The method as claimed in claim 4, further comprising invalidating a selecting operation of the address storing circuit based on the row address in response to the second command.

8. The method as claimed in claim 4, further comprising:
   comparing, by an address comparing circuit, the column address with the defective address, the column relief circuit further includes the address comparing circuit; and
   invalidating, by the determination circuit, a comparing operation of the address comparing circuit in response to the second command.

9. The method as claimed in claim 4, further comprising:
   comparing the column address with the defective address; and
   invalidating the comparing in response to the second command.

10. A method comprising:
    accessing, by a first access control circuit, a memory cell array circuit in response to each of first address information and second address information, the first address information being supplied from outside of the first access control circuit, the second address information being produced internally, each of the first and second address information including first and second address parts, the first address part designating one of a plurality of memory mats, the second address part designating a memory cell set,
    wherein the memory cell array circuit includes the plurality of memory mats, each of the memory mats comprising a plurality of memory cell sets, each of the memory cell sets including a plurality of normal memory cells and at least one redundant memory cell;
    receiving, by a second access control circuit that includes a redundant control circuit, third address information and storing a plurality of defective address information;
    selecting, by the redundant control circuit, at least one of the plurality of defective address information in response to information related to the first address part and accessing the redundant memory cell in place of the normal memory cells when the third address information is coincident with a selected one of the plurality of defective address information;
    activating the redundant control circuit when the first address information is supplied to the first access control circuit; and
    deactivating the redundant control circuit when the second address information is supplied to the first access control circuit.

11. The method as claimed in claim 10, further comprising producing, by a refresh counter, the second address information, the first access control circuit includes the refresh counter.

12. The method as claimed in claim 11, further comprising receiving, by the first access control circuit, the second address information when a refresh mode is designated and the first address information when a refresh operation is not designated.

13. The method as claimed in claim 10, further comprising supplying the first address part to the redundant control circuit;
    opening the gate circuit to bring the redundant control circuit into an activated state when the first address information is supplied to the first access control circuit; and
    closing the gate circuit to bring the redundant control circuit into a deactivated state when the second address information is supplied to the first access control circuit.

14. The method as claimed in claim 13, further comprising performing data read and write operations, by first and second access control circuits, on a selected one of the normal and redundant memory cells in response to the first address information, the third address information and the defective addresses, and the first access control circuit performs a refresh operation on a selected one of the memory cell sets in response to the second address information.

15. A method comprising:
supplying each of a plurality of row access control circuits with row address information and configured to select one of a plurality of memory mats in response to a first part of the row address information and one of a plurality of normal word lines of a selected memory mat from among the plurality of memory mats in response to a second part of the row address information,
wherein a plurality of memory banks each includes the plurality of memory mats, each of the memory mats includes the plurality of normal word lines, a plurality of normal bit lines each intersecting the normal word lines, the plurality of normal memory cells each disposed at an associated one of intersections of the normal word and normal bit lines, at least one redundant bit lines intersecting the normal word lines, and a plurality of redundant memory cells each disposed at an associated one of intersections of the normal word lines and the redundant bit line, and a plurality of row access circuits each coupled to an associated one of the memory banks;
supplying each of the column access circuits with column address information and mat designation information related to the first part of the row address information and storing a plurality of column defective addresses, the plurality of column access circuits each coupled to an associated one of the memory banks;
activating each of the column access circuits in a data read/write operation mode to select at least one of the defective addresses in response to the mat designation information and to select one of normal bit lines when the column address information is not coincident with a selected one of the defective addresses and the redundant bit line when the column address information is coincident with the selected one of the defective addresses; and
deactivating each of the column access circuits in a refresh operation mode.

16. The method as claimed in claim 15, wherein selected one or ones of the memory mats in each of the memory blocks further includes at least one redundant word lines intersecting the normal and redundant bit lines and a plurality of additional redundant memory cells each disposed at an associated one of intersections of the redundant words lines and the normal and redundant bit lines, and each of the row access control circuits stores at least one row defect address and select the redundant word line of a selected memory mat when the row address information is coincident with the row defect addresses.

17. The method as claimed in claim 15, further comprising generating, by a refresh counter, the refresh address information being supplied to each of the row access circuits as the row address information in the refresh operation mode.

* * * * *